United States Patent
Harting et al.

[11] Patent Number: 6,156,970
[45] Date of Patent: Dec. 5, 2000

[54] CASING FOR HOUSING ELECTRICAL AND/OR ELECTRONIC COMPONENTS

[75] Inventors: Dietmar Harting, Espelkamp; Wulf Müller, Wuppertal; Marek Ciezarek, Lübbecke, all of Germany

[73] Assignee: Harting KGaA, Espelkamp, Germany

[21] Appl. No.: 09/271,696

[22] Filed: Mar. 18, 1999

[30] Foreign Application Priority Data

Mar. 19, 1998 [DE] Germany ............ 198 12 042

[51] Int. Cl.[7] .................. H02G 3/08; H05K 5/00
[52] U.S. Cl. ............ 174/52.1; 257/714; 361/688; 361/689; 361/699; 174/17 LF
[58] Field of Search ............... 174/52.1, 52.3, 174/17 LF; 257/706, 714, 729, 715; 361/676, 677, 688, 689, 699, 724

[56] References Cited

U.S. PATENT DOCUMENTS

| | | | |
|---|---|---|---|
| 3,629,758 | 12/1971 | Pearce, Jr. ................................. | 336/57 |
| 3,942,010 | 3/1976 | Peterson et al. ........................ | 250/352 |
| 3,979,549 | 9/1976 | Wilkinson .............................. | 428/450 |
| 4,361,721 | 11/1982 | Massey .................................... | 174/92 |
| 4,847,731 | 7/1989 | Smolley .................................. | 361/385 |
| 5,122,926 | 6/1992 | Lev ......................................... | 361/385 |
| 5,560,986 | 10/1996 | Moritmer, Jr. ....................... | 428/308.4 |

FOREIGN PATENT DOCUMENTS

| | | |
|---|---|---|
| 0 778 180 A1 | 6/1997 | European Pat. Off. . |
| 76 00 945 U1 | 7/1977 | Germany . |
| 37 19 637 A1 | 12/1988 | Germany . |
| 196 06 481 C1 | 3/1997 | Germany . |
| 197 01 469 C1 | 8/1998 | Germany . |
| 4-99 586 U | 8/1992 | Japan . |
| 9-207 691 | 8/1997 | Japan . |
| 10-224 955 | 8/1998 | Japan . |

Primary Examiner—Kristine Kincaid
Assistant Examiner—W. David Walkenhorst
Attorney, Agent, or Firm—McEachran, Jambor, Keating, Bock & Kurtz

[57] ABSTRACT

Figure 1:
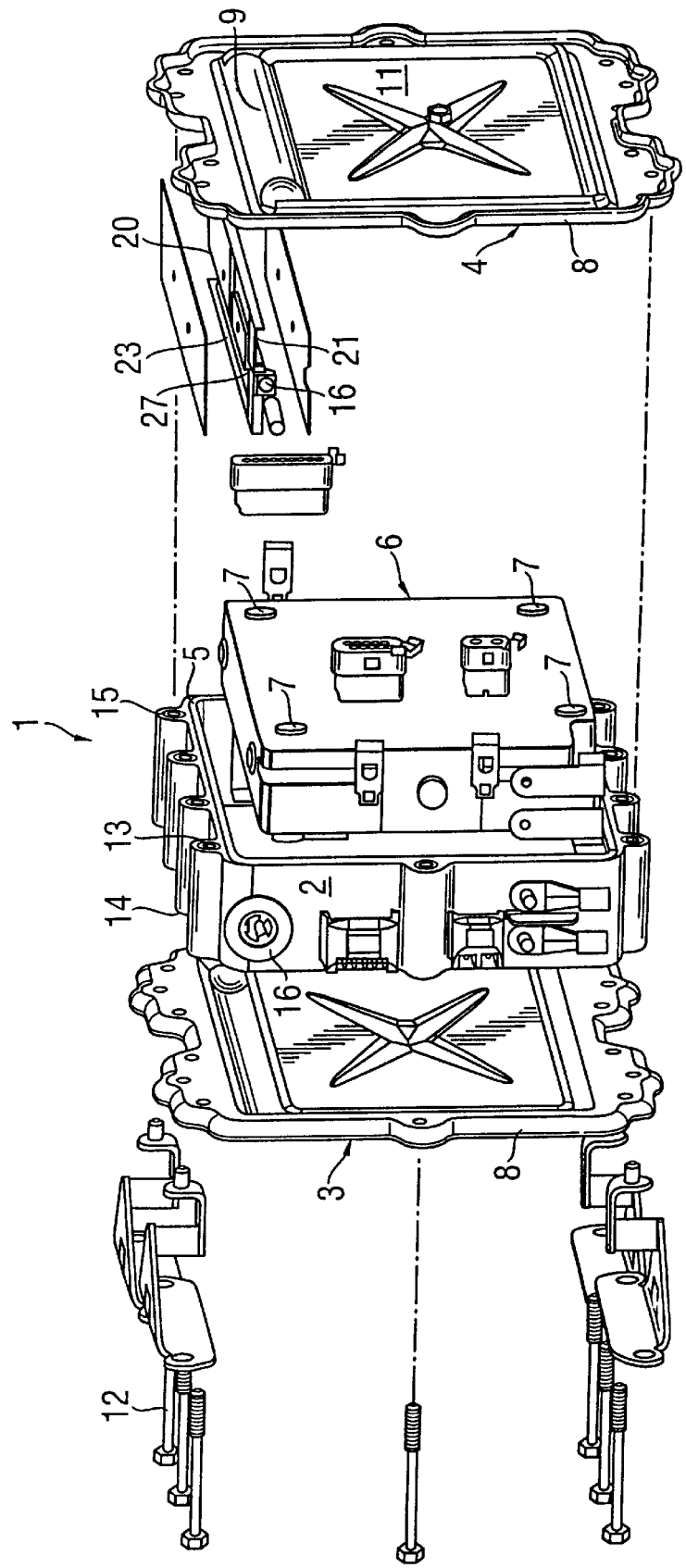

A casing (1) for housing electrical and/or electronic components (6) surrounded by a cooling medium (10), the said casing consisting of a frame (2) and an upper and a lower closing-wall part (3, 4), is constructed in such a way that the frame (2) and/or one closing-wall part (3, 4) consists of electrically insulating, castable material and comprises electrical connecting parts (50) integrally cast in the said material, the frame (2) and the closing-wall parts (3, 4) jointly enclosing, in a pressure-tight manner, a housing space which can be filled with a coolant (10) for the boiling-bath cooling of the electrical and/or electronic components (FIG. 1).

21 Claims, 21 Drawing Sheets

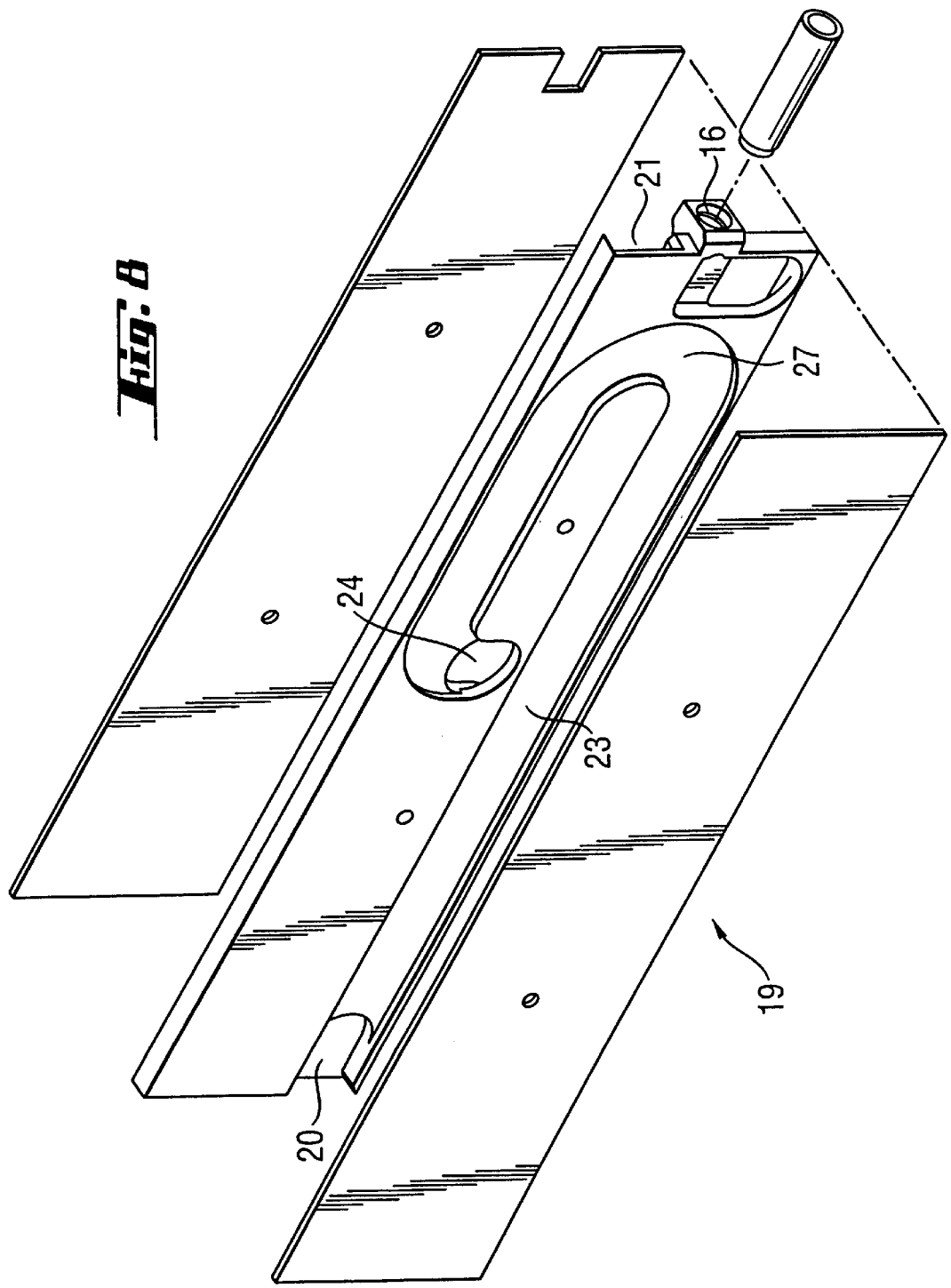

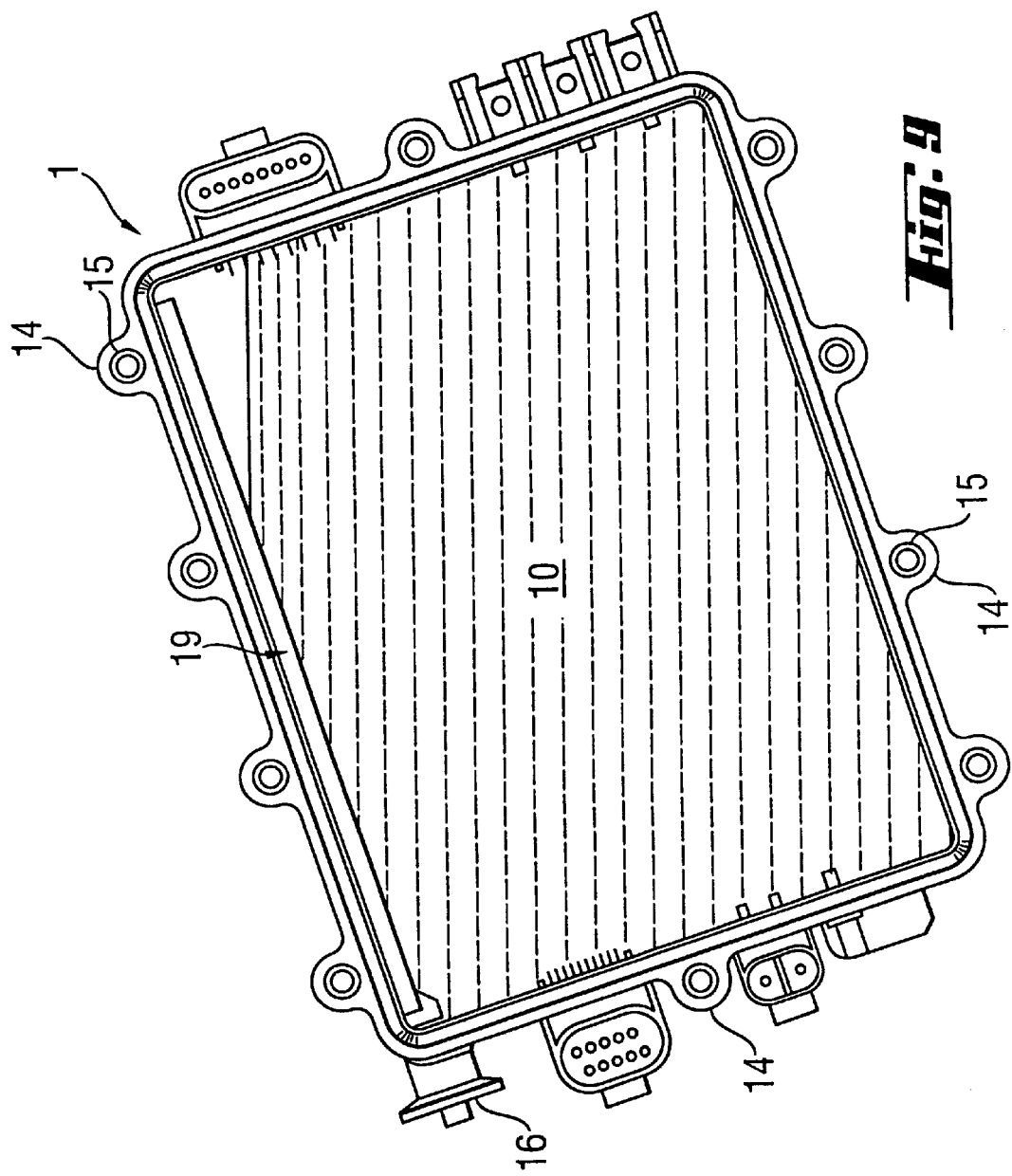

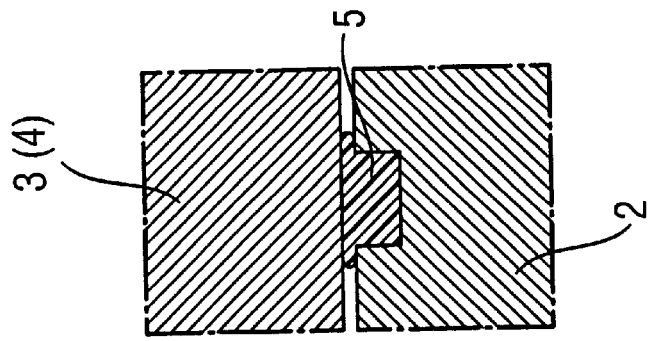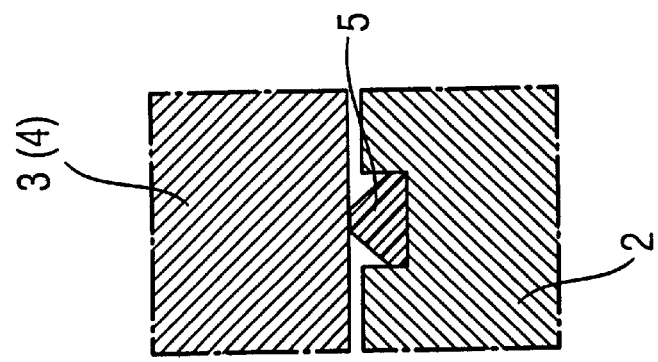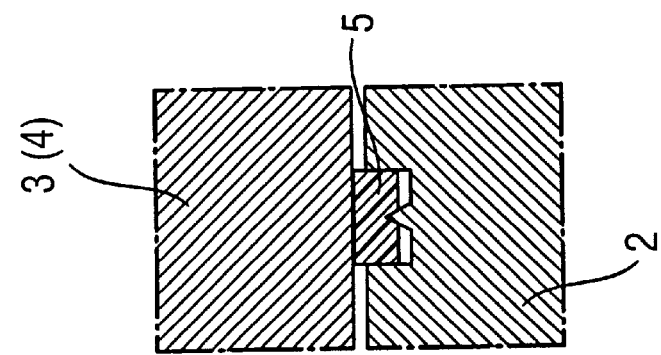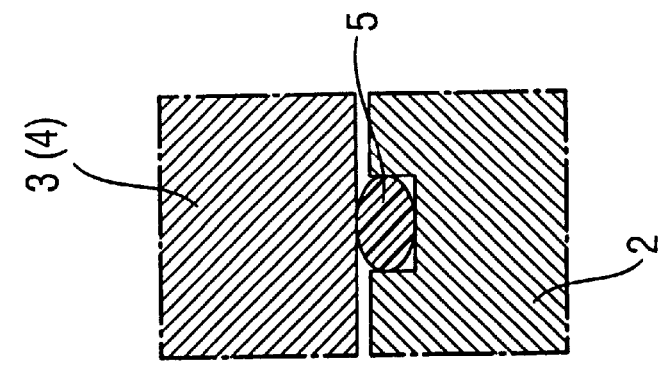
Fig. 19

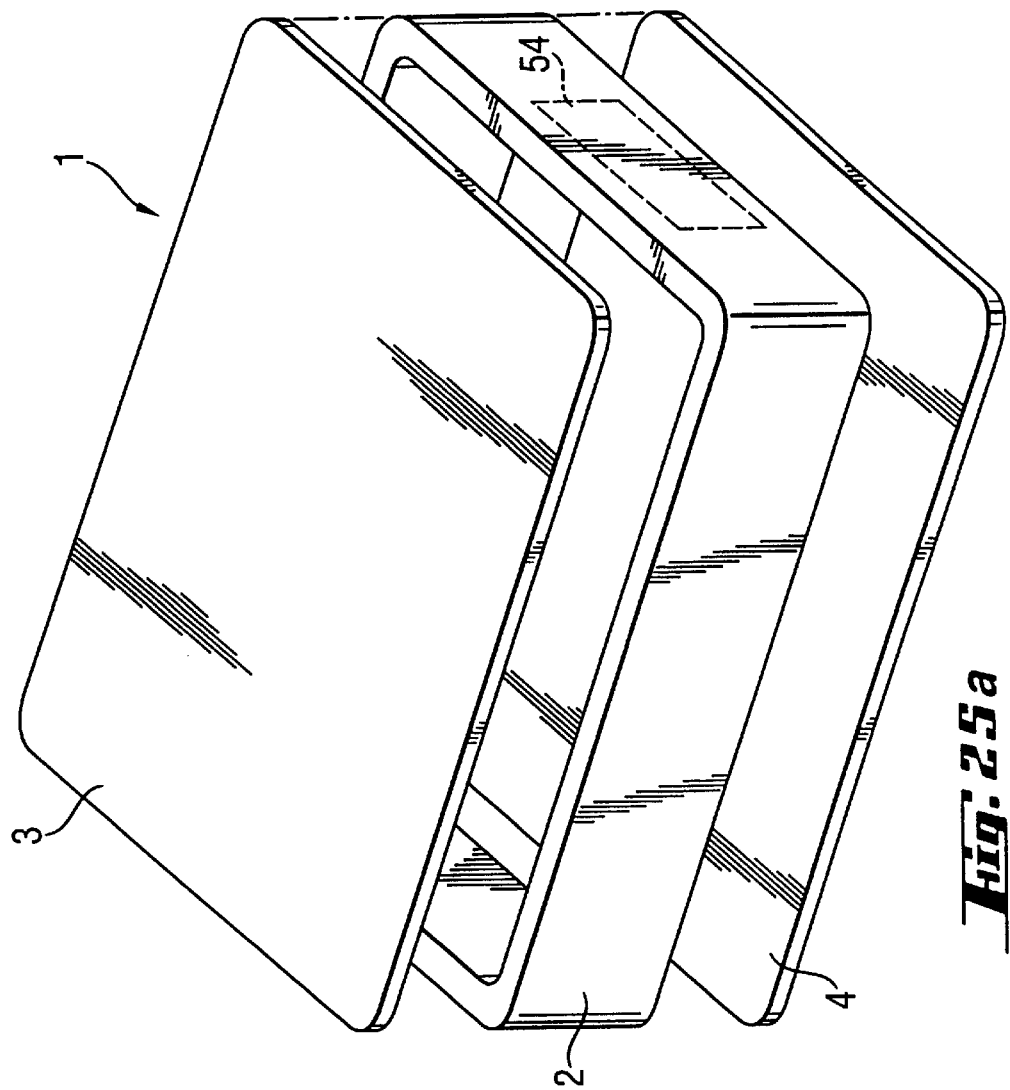

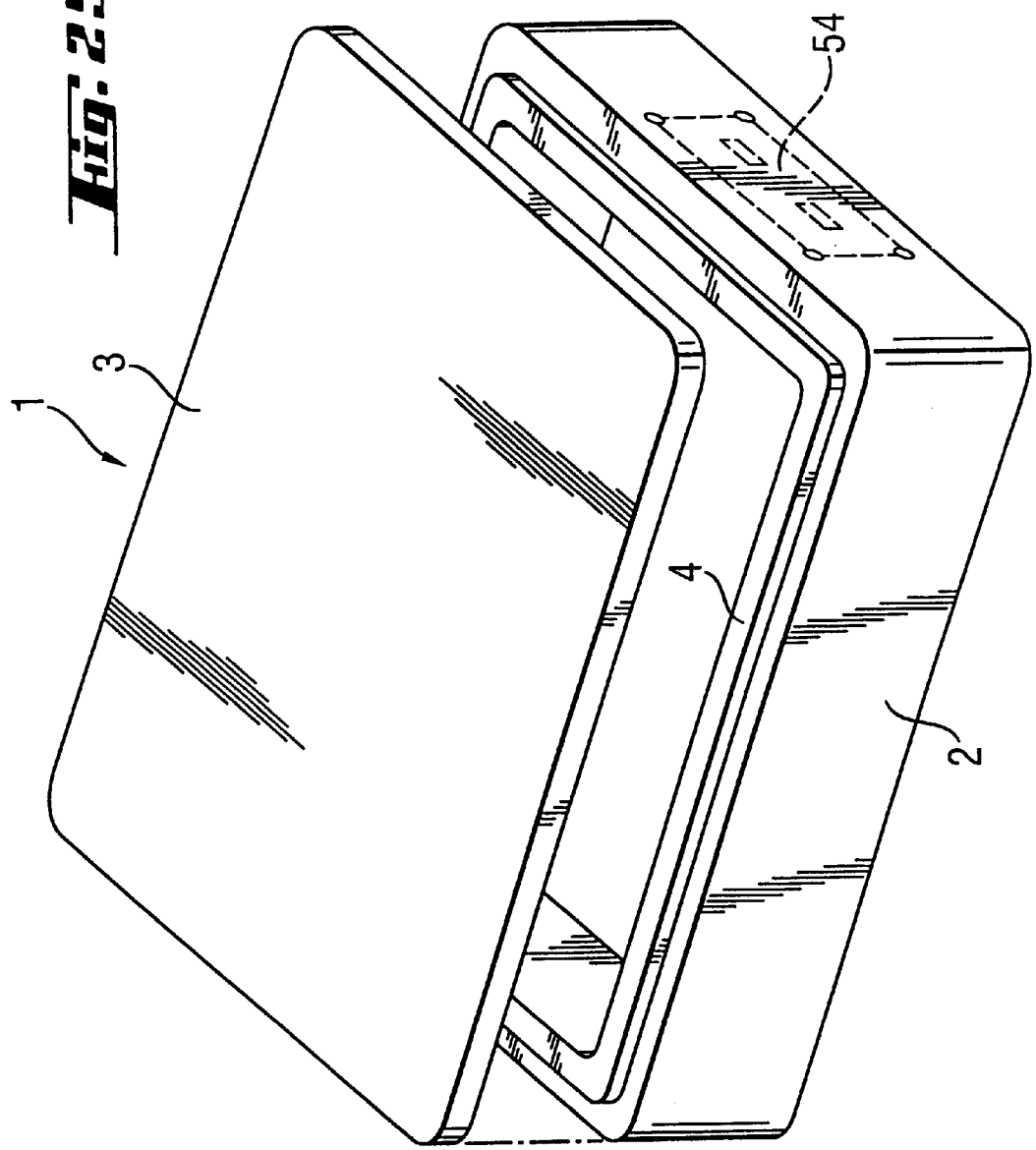

CASING FOR HOUSING ELECTRICAL AND/OR ELECTRONIC COMPONENTS

The invention relates to a casing for housing electrical or electronic components, according to the pre-characterising clause of claim 1.

Casings of this kind are particularly used in order to house power-electronic components which exhibit a high emission of heat during operation and are therefore surrounded by a cooling medium. The semiconductors used in power electronics of this kind can be subjected to load up to a maximum temperature, and the cooling agent must ensure that this temperature is not reached at any time, either during operation or under the effect of heat from outside. This maximum temperature is typically about 150° C.

Particularly when a casing of this kind is used in mobile units with changing operating conditions, such as motor vehicles for instance, considerable temperature fluctuations occur, in spite of which the functionality of the casing and of the coolant contained therein has to be guaranteed over a temperature interval of about +150° C. to some −10° C. At the same time, account must also be taken of the fact that the pressure of the cooling medium changes with the temperature.

In addition it is necessary, for the functioning of the electronic components, to ensure high requirements in respect of stability and the isolation of the housed components from the environment in respect of shock and vibration. The problem underlying the invention is to provide a generic casing which ensures the functioning of the housed components over a wide temperature range.

The invention solves this problem by means of a casing having the features of claim 1. Attention is drawn to claims 2 to 21 in respect of other advantageous refinements.

The casing according to the invention may be directly filled with coolant and the components may be suspended in the said coolant. As a result of the pressure-tightness of the connection between the closing-wall part or parts and the side-wall part, and of the sealed housing, in a manner integrated into parts of the wall, of electrical connecting parts, it is ensured, over a large pressure range of the cooling medium—and thereby over a wide temperature range—that no cooling medium can escape in an uncontrolled manner and therefore the cooling function of the cooling medium for the components is not impaired. For improved sealing between the integrally cast electrical connecting parts and the side-wall part or closing-wall part which houses the connecting parts, there may be disposed between the said parts an additional sealing compound which is formed from permanently elastic, soft material which adheres to metal and plastic, so that even in the event of large fluctuations in temperature, the different temperature coefficients of the materials do not lead to leakage in the region of the gap between the different materials.

In an advantageous refinement, the side-wall region is constructed as a circumferential frame which is clamped-in on both sides by cover parts. A frame of this kind is accessible during fitting and during the manufacture of the two sides, a fact which is advantageous for removal from the mould in the case of integrally cast electrical contacts. In addition, both the cover parts may have an elastically deformable region for adapting to a pressure difference between the pressures prevailing inside and outside the casing. In the event of a rise in temperature and pressure within the casing, an enlarging of the volume takes place as a result of outward arching of the said regions, so that the upward rise in the level of the cooling medium is inhibited. Conversely, inward arching of the deformable regions is possible, in the event of particularly low temperatures, in order to diminish the volume. As a result of this, even components disposed in the upper region of the casing remain surrounded by cooling medium at the most varied pressures, and the level of the said cooling medium is, to a great extent, kept constant. Also contributing to this in a particularly advantageous manner are receiving pockets in the upper region of the casing, which receive a large part of the rising cooling medium in the event of a temperature rise, and corresponding expansion, in the said medium, so that the rise in level is stemmed. Otherwise, in the event of too great a rise in the level, cooling medium would be forced out of the casing via a compensating line, so that the cooling function would not be adequately guaranteed.

In order to achieve cooling and recondensation of evaporated cooling medium, there is provided, in the upper region of the casing, a gas line which is connected to a cooler via an exit aperture and, in a particularly advantageous manner, is so constructed that the gas line has two entry apertures in the upper corner regions of the casing, to which entry apertures there are connected parts of the line which are in communication with one another in the central region of the casing, a further part of the line branching off to the exit aperture from the said central region. In the event of the mobile unit being located obliquely, the central upper region of the casing can then be flooded with liquid cooling medium without the latter being able to leave the casing via the exit aperture. As a result of this, the casing can be filled up with cooling medium as far as the upper region.

Further advantages and details emerge from the exemplified embodiments of the subject of the invention which are represented in the drawings.

Figure 2:
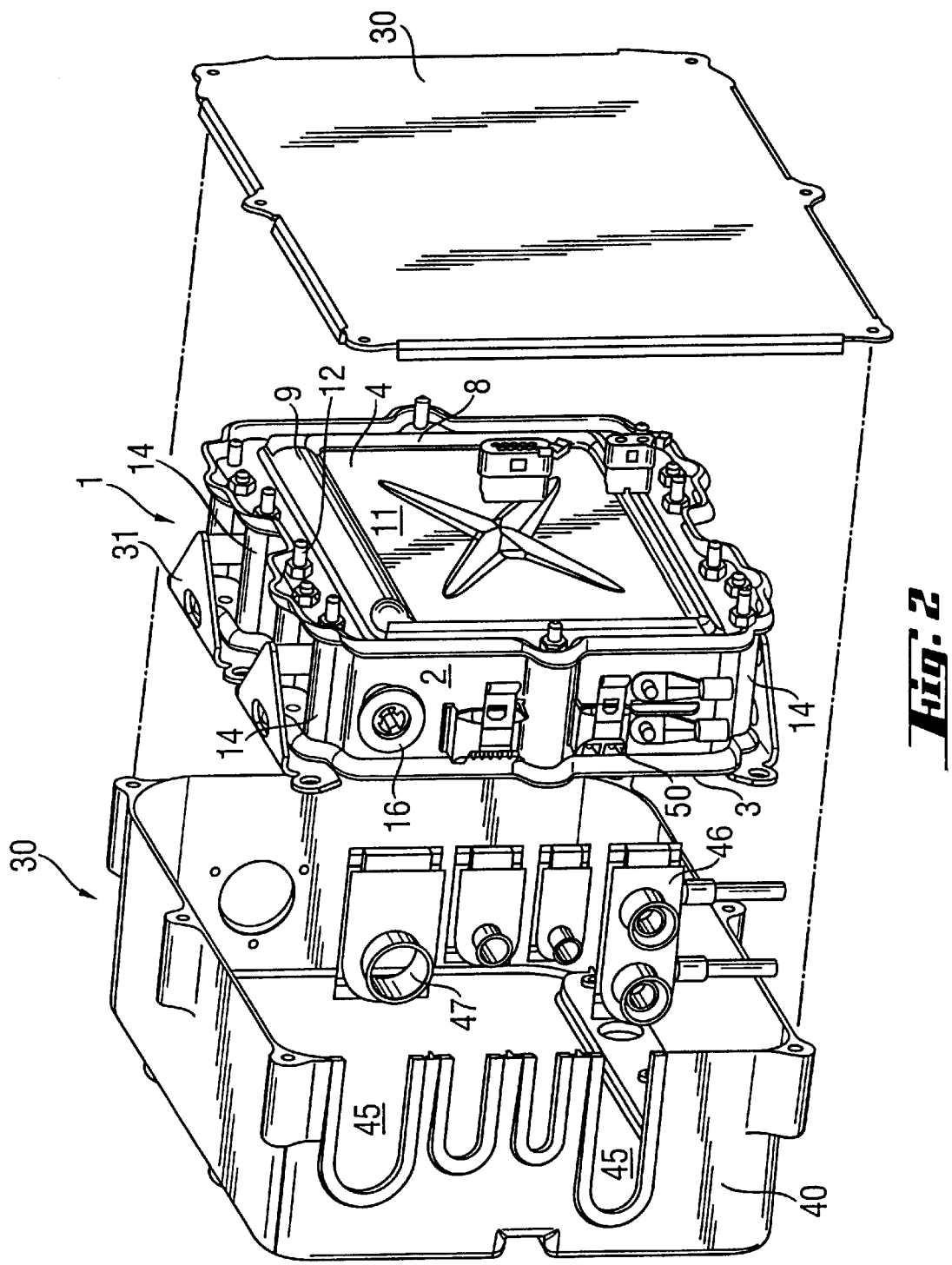
Figure 3:
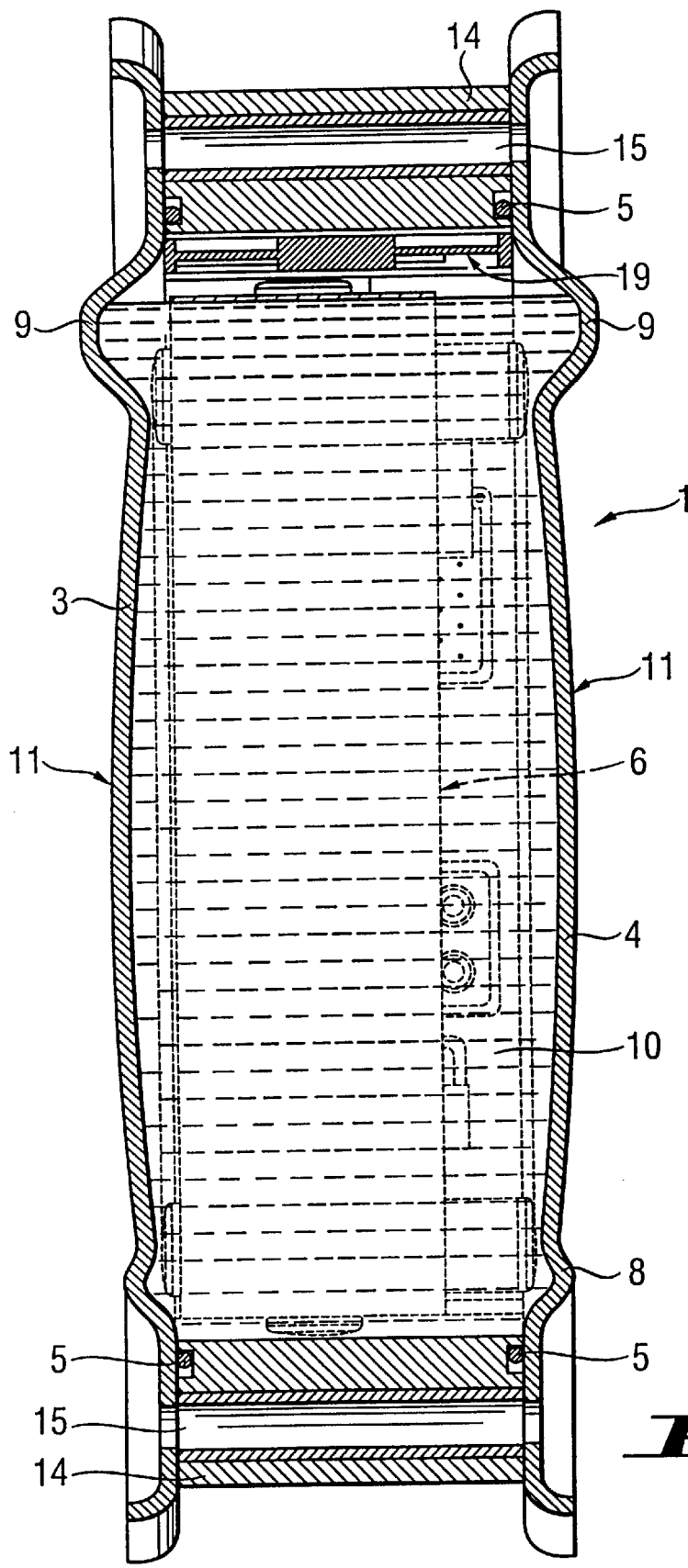
Figure 4:
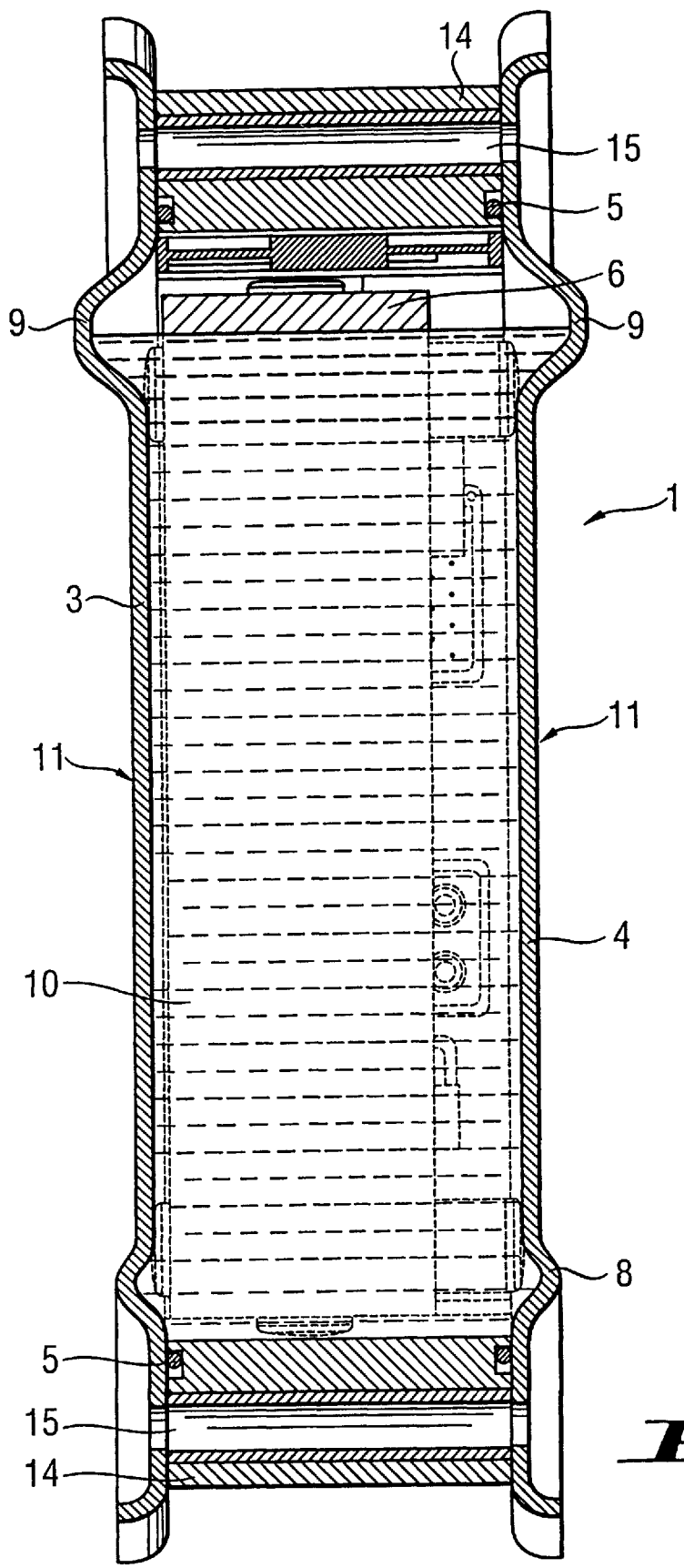
Figure 5:
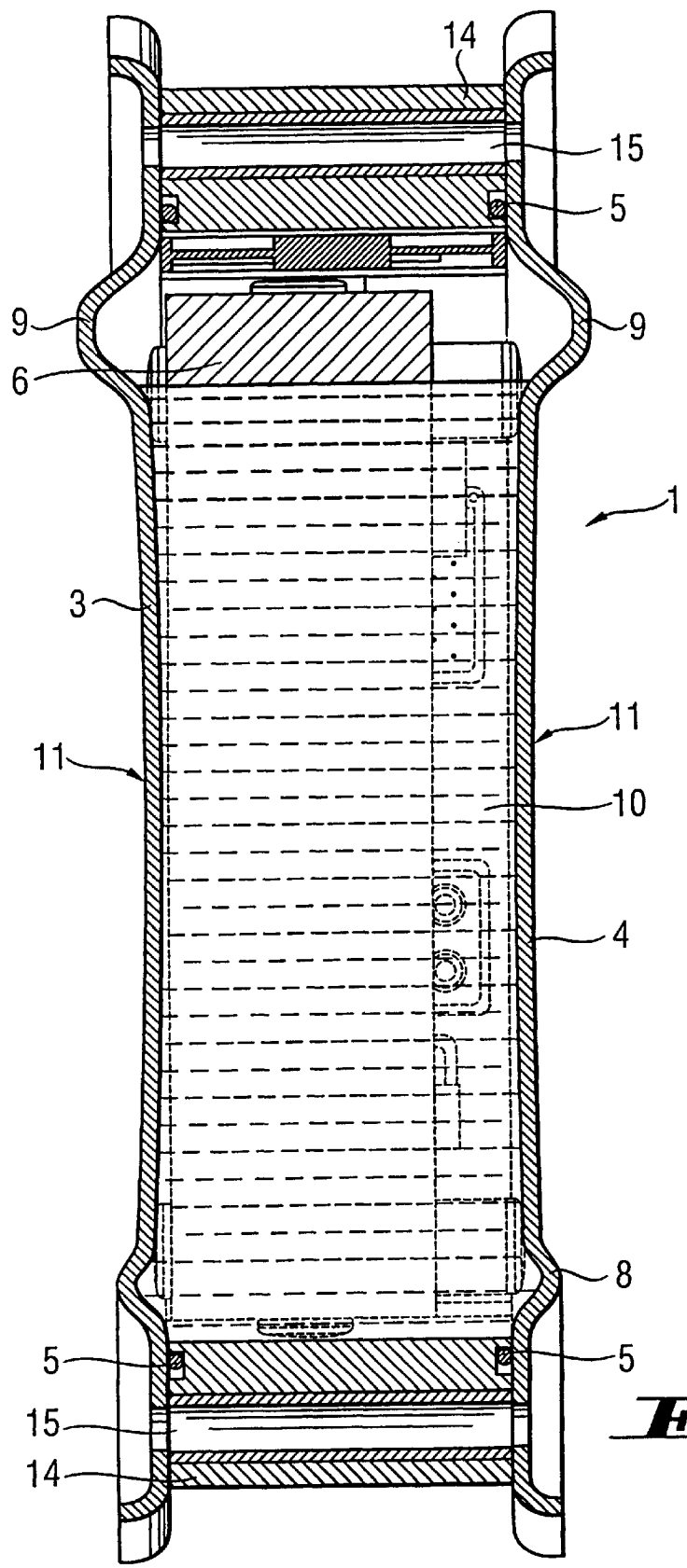
Figure 6:
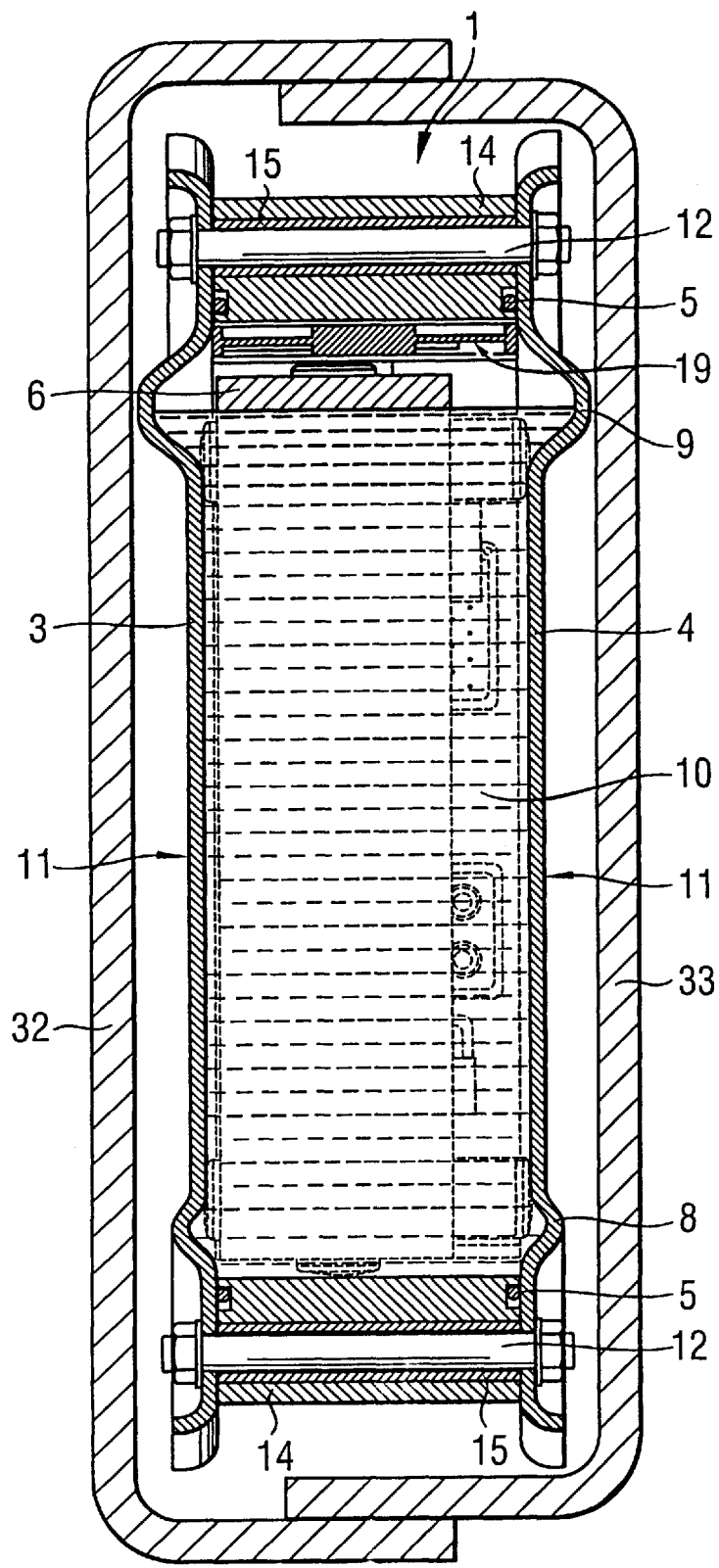
Figure 7:
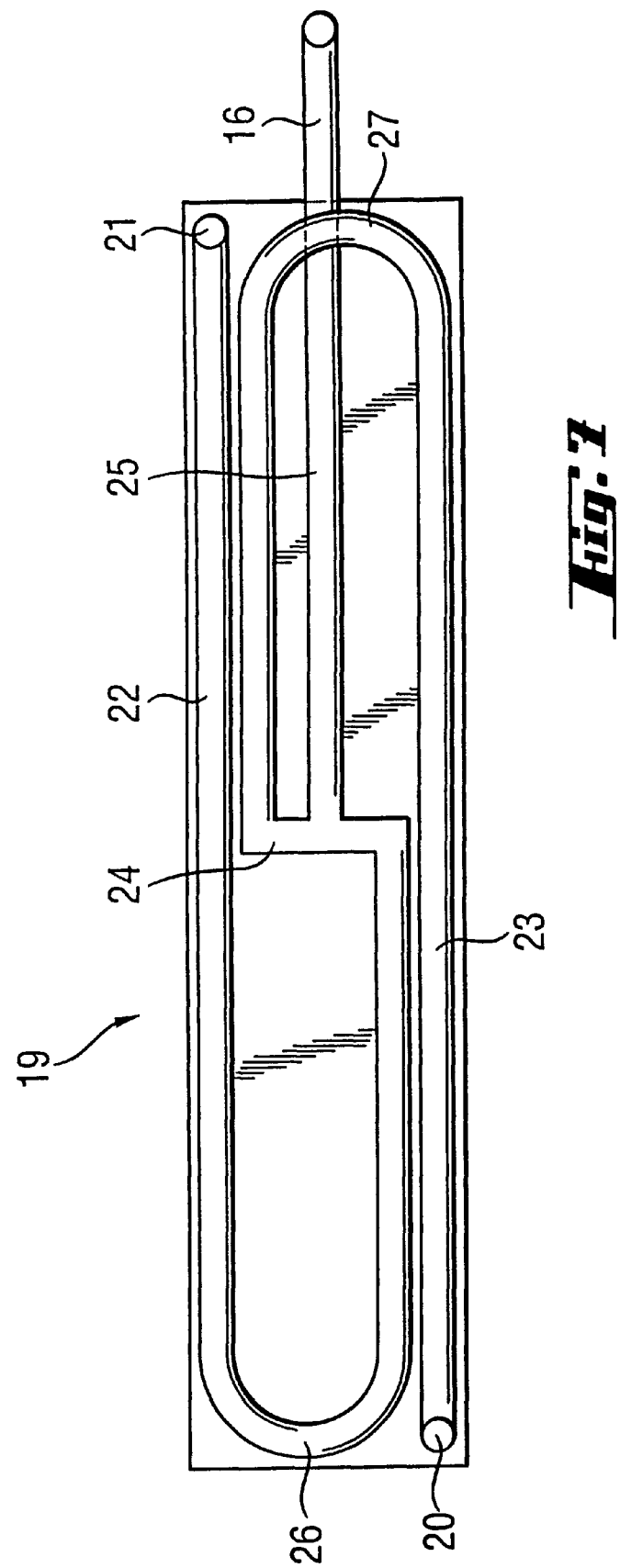
Figure 11:
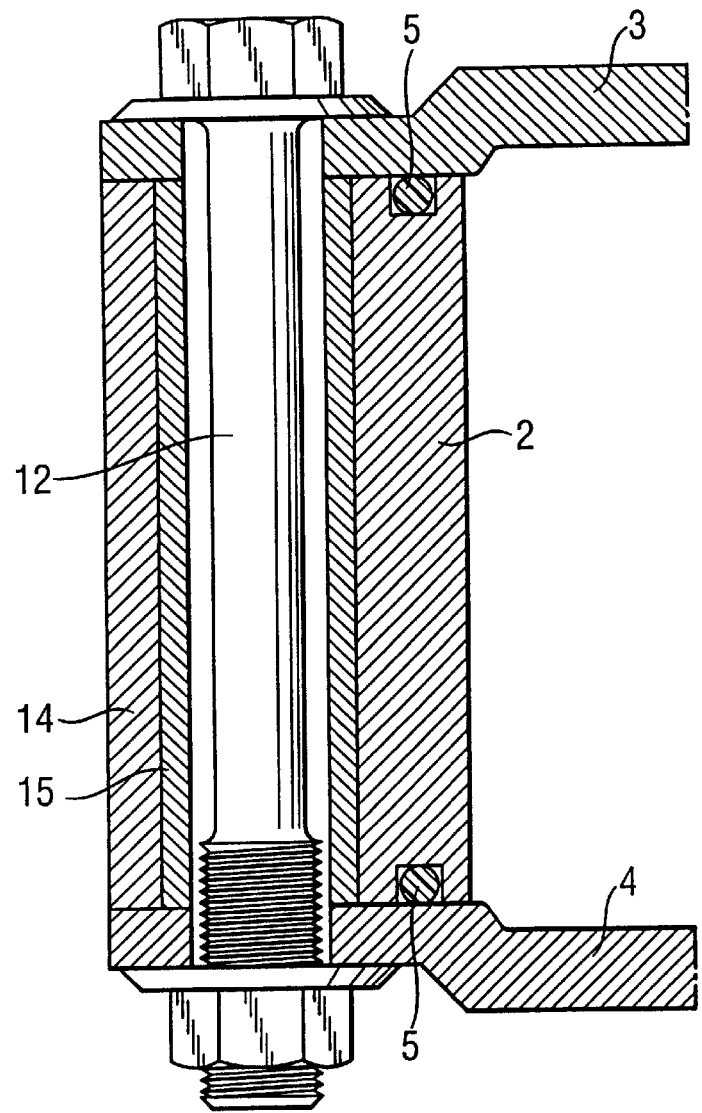
Figure 10:
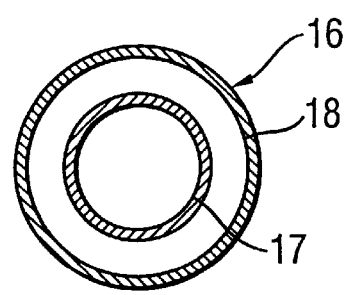
Figure 12:
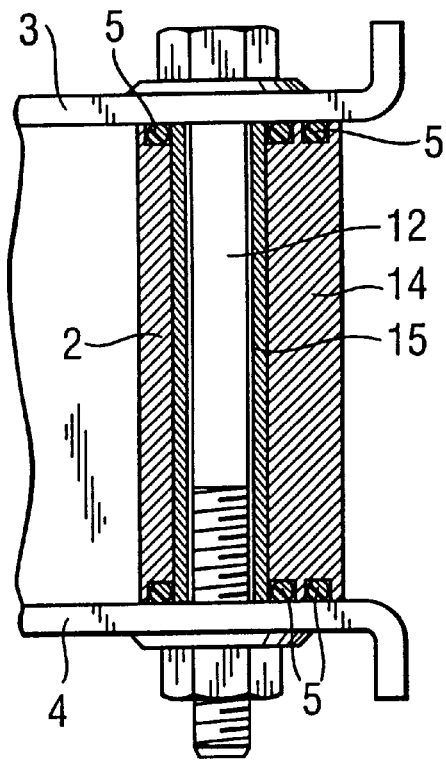
Figure 14:
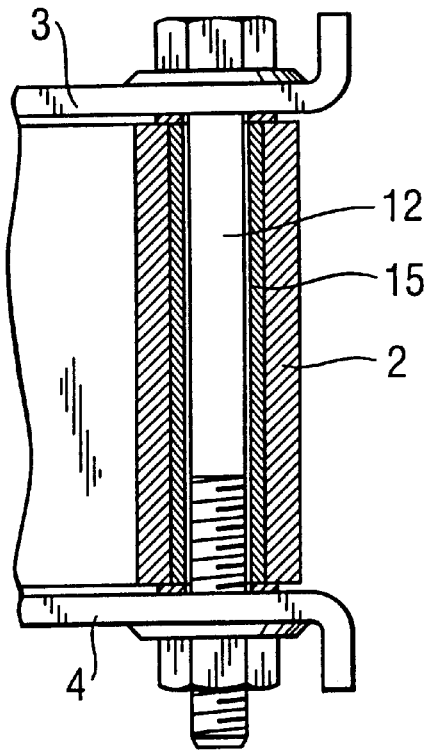
Figure 13:
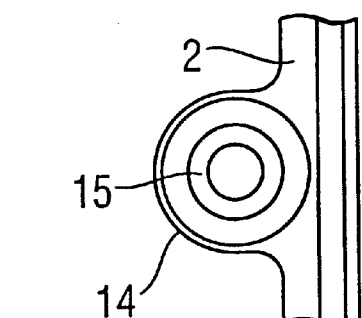
Figure 15:
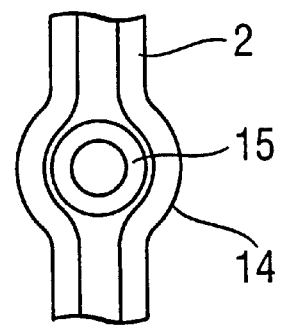
Figure 16:
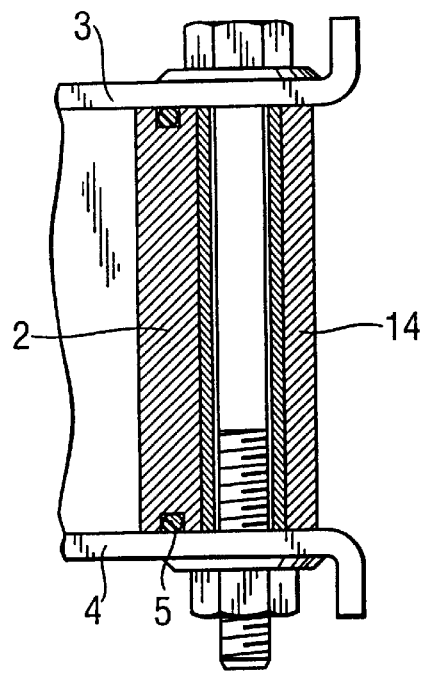
Figure 17:
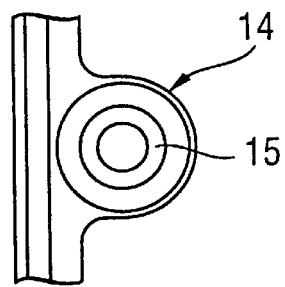
Figure 18:
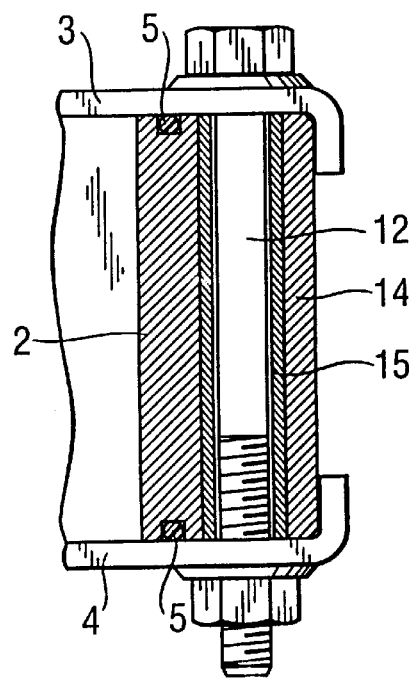
Figure 20:
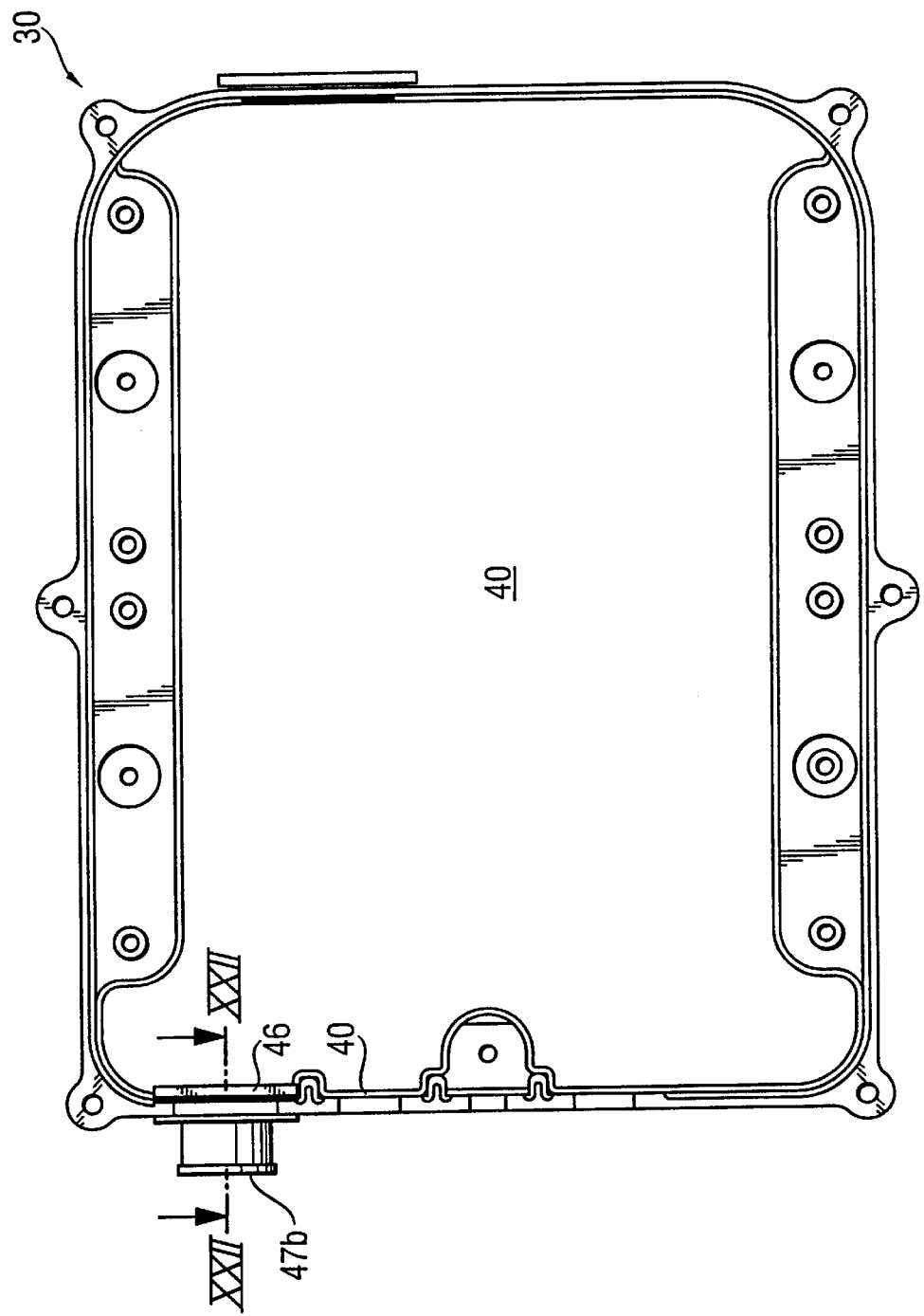
Figure 21:
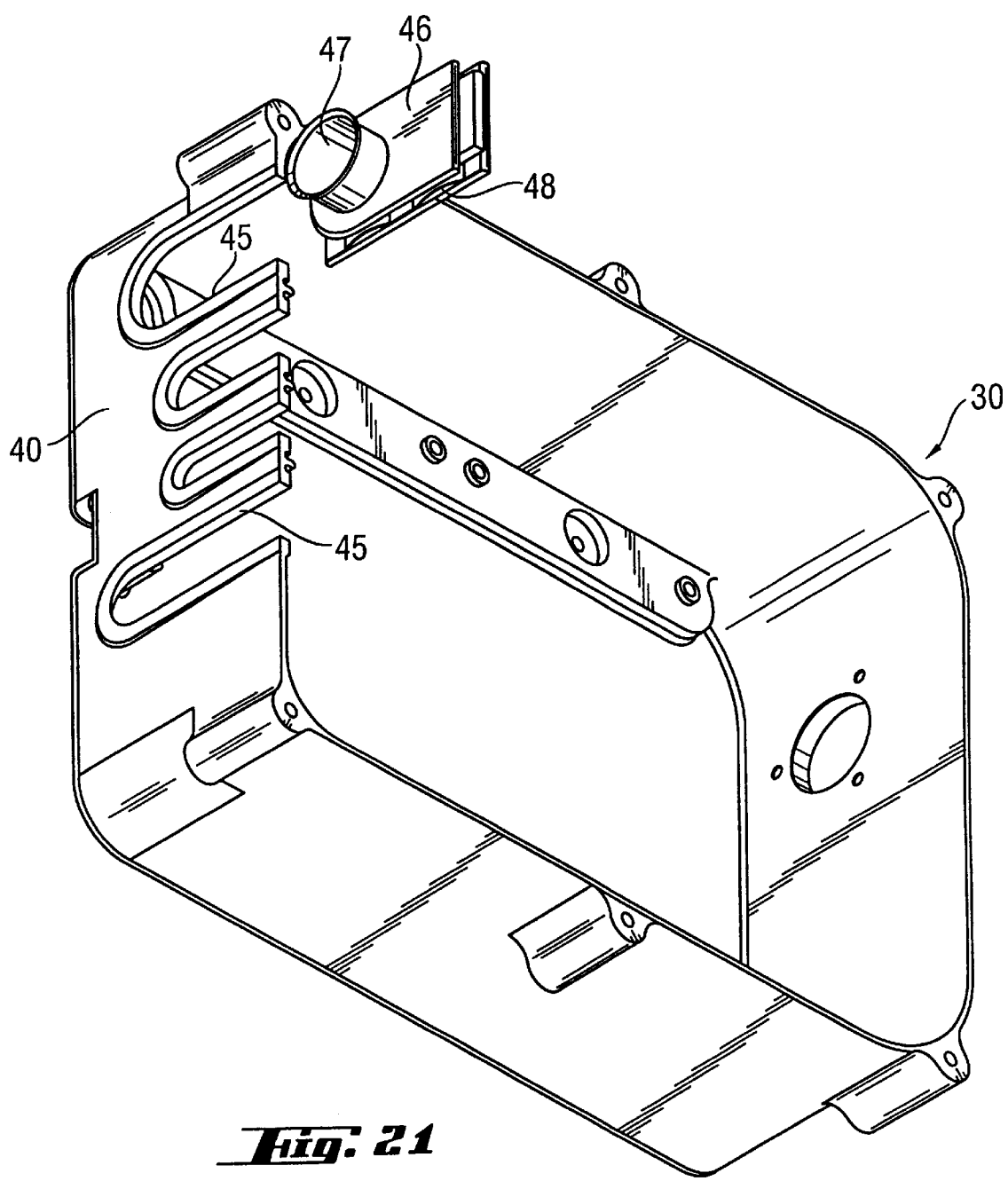
Figure 22:
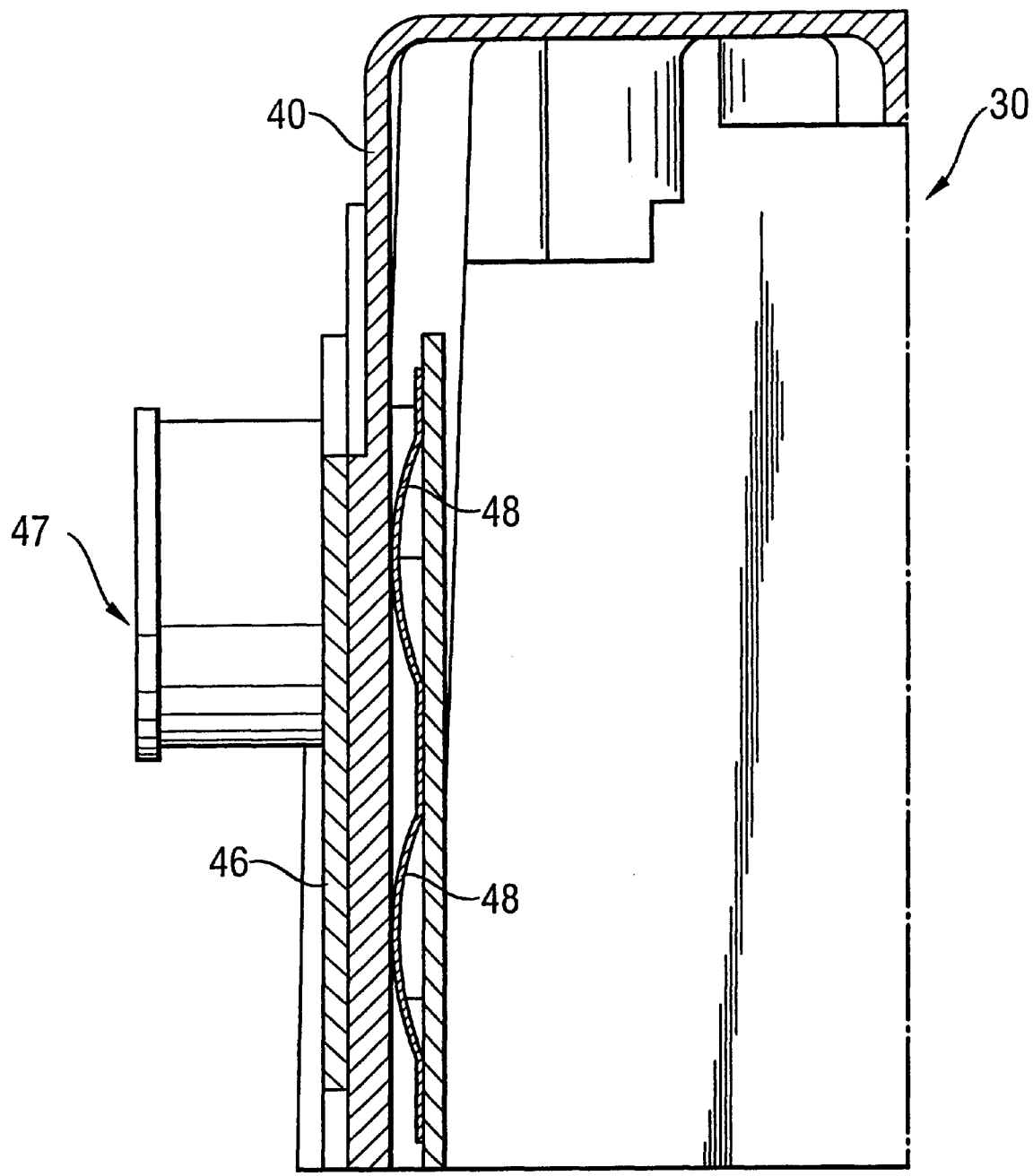
Figure 23:
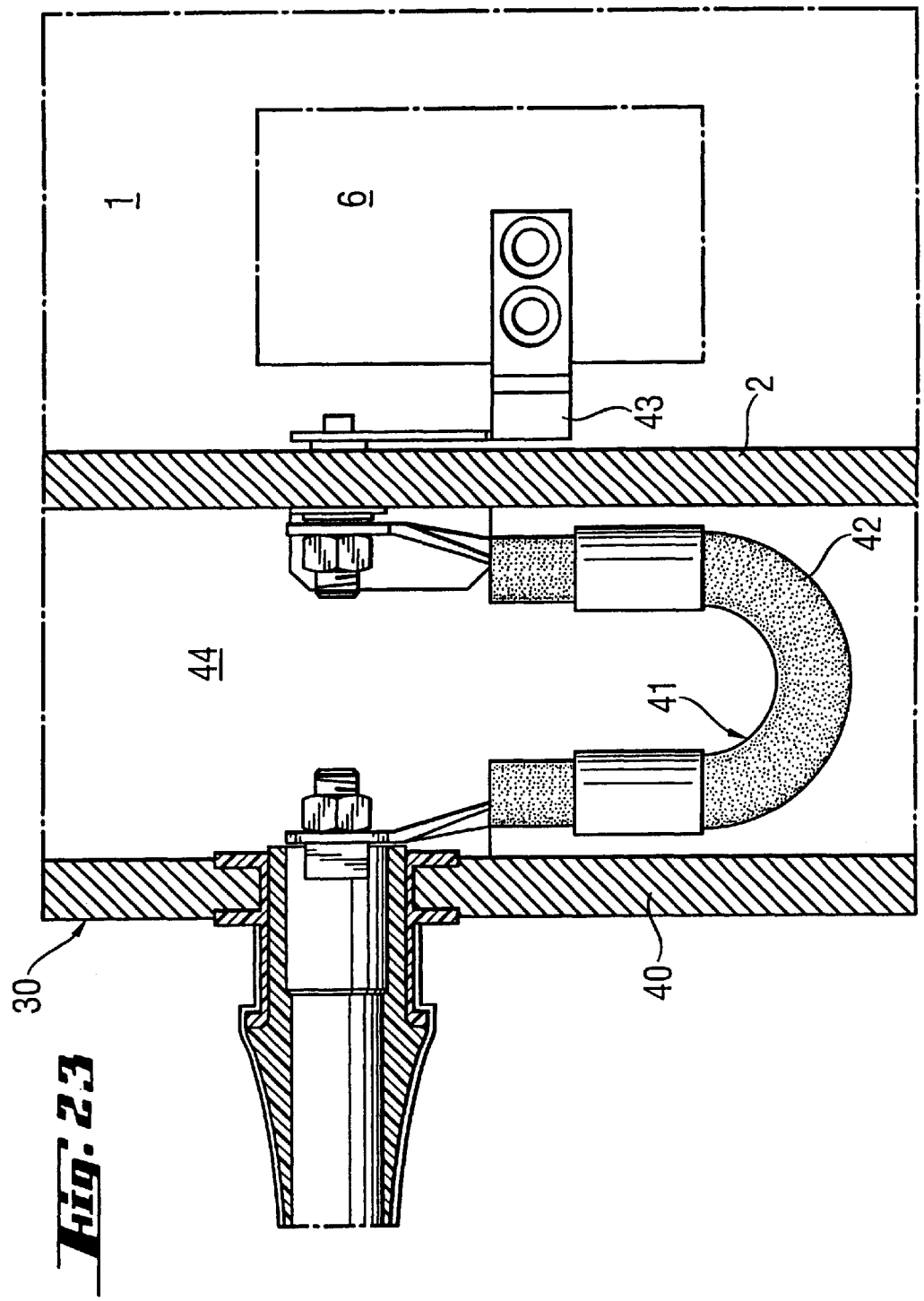
Figure 24:
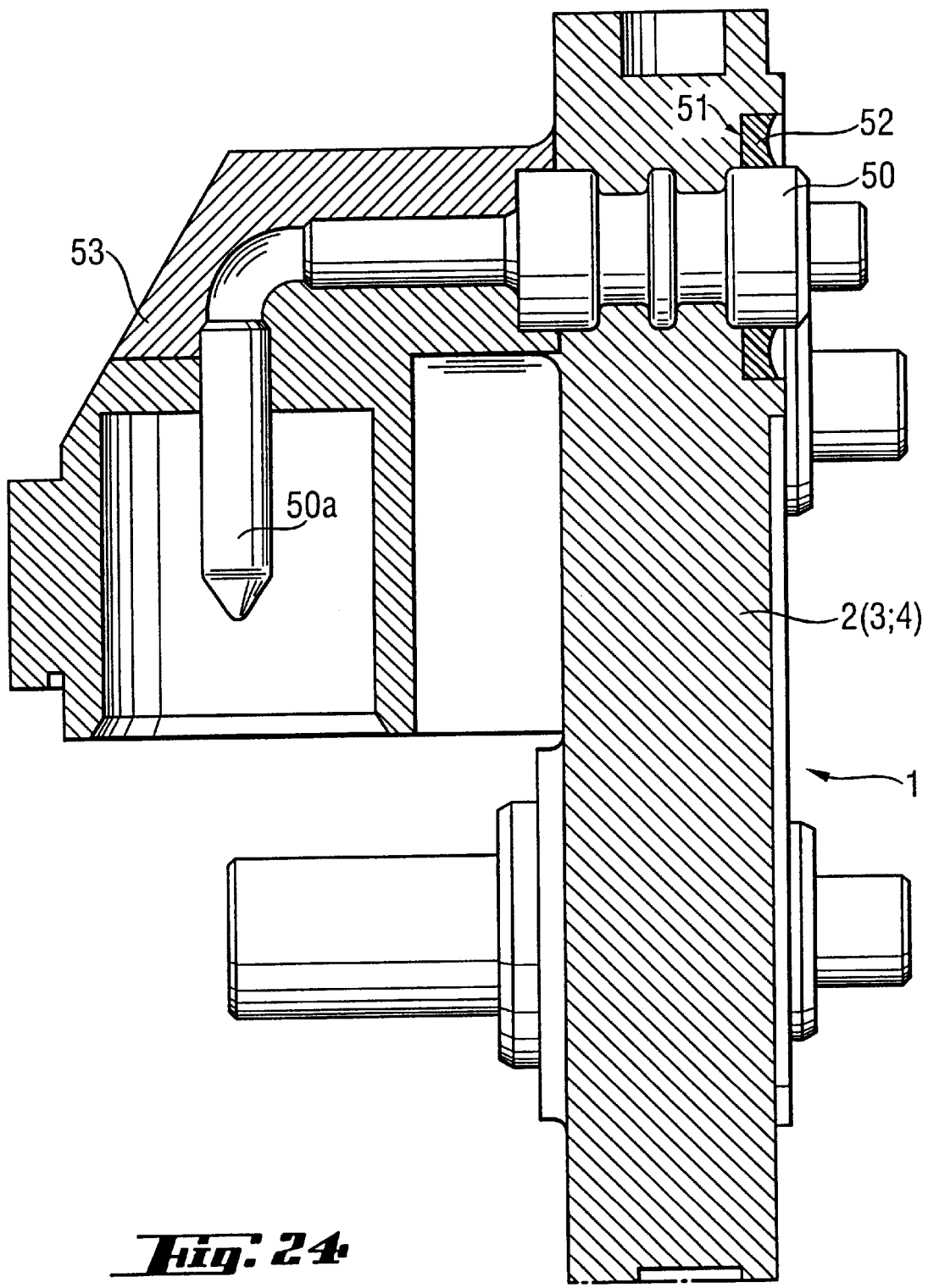

In the latter:

FIG. 1 shows an exploded representation of a casing according to the invention, FIG. 2 shows the casing according to FIG. 1 when used in an outer casing forming a capsule, FIG. 3 shows the casing according to FIG. 1 in longitudinal section, with a superatmospheric pressure in the casing and at high temperature, FIG. 4 shows a similar view to that in FIG. 3, at normal pressure and room temperature, FIG. 5 shows a similar view to that in FIG. 4, with a subatmospheric pressure prevailing in the casing and at low temperature, FIG. 6 shows a similar view to that in FIG. 4, with a thermal insulation surrounding the casing, FIG. 7 shows a detail view of a gas line in the upper region of the casing, FIG. 8 shows the gas line according to FIG. 7 in an exploded representation, FIG. 9 shows the casing at an extreme inclination, FIG. 10 shows a detail view of the gas exit aperture, FIG. 11 shows a detail view of the edge region of the frame of the casing, which edge region is clamped-in by the cover parts, FIG. 12 shows a similar view to that in FIG. 11, with the clamping element located inside the casing, FIG. 13 shows a plan view of the part according to FIG. 12, FIG. 14 shows a similar view to that in FIG. 12, with the screwed connection located centrally in the frame, FIG. 15 shows a similar view to that in FIG. 14, in plan view, FIG. 16 shows a similar view to that in FIG. 14, with the clamping element located outside the casing, FIG. 17 shows a plan view of the part according to FIG. 16, FIG. 18 shows a similar view to that in FIG. 16, with plastic frames supported on the edge of the cover, FIG. 19 shows various sealing principles for connecting the frame to the cover parts in a pressure-tight manner, FIG. 20 shows the outer casing in side view, FIG. 21 shows the outer casing in an open, perspective representation, FIG. 22 shows a section along the line XXII—XXII in FIG. 20, FIG. 23 shows a section through the casing wall and also a wall of the outer casing, and the disposition of a connecting cable, FIG. 24 shows a detail view of the embedding of an electrical connecting part in a closing-wall part or side-wall part of the casing, and FIG. 25 shows a diagrammatic view of three different types of casing.

In an exemplified embodiment, the casing 1 has a circumferential frame 2 as a side-wall part, and also wall-closing or closing-wall parts 3, 4 which are disposed on both sides of the frame 2 and are constructed as or lid cover parts. The closing-wall parts 3, 4 are fixedly clamped onto the frame 2 and the connection is pressure-tight, for which purpose a seal 5 running round the frame 2 is provided on each side of the said frame 2. It is also possible for the side-wall part to be constructed so as to be integral with one closing-wall part, and for only the closing-wall part on the side opposite the said closing-wall part to be constructed as a separate cover part.

In the position of use, the casing 1 stands vertically upright, so that the wall-closing parts 3, 4 on the upper and lower sides assume a perpendicular location.

In the casing 1, an assembly 6 of electrical and/or electronic components is kept within a cooling medium, it being possible for the assembly 6 to be supported in relation to the casing via pressure buffers 7.

At the edges, the closing-wall parts 3, 4 are provided with circumferential, shape-preserving reinforcements 8, for example beads. In the upper region of the casing 1, these are constructed as outwardly protruding beads 9. These not only fulfil a shape-preserving function but also form outwardly moulded receiving pockets for cooling medium 10. If, therefore, there is a rise in pressure and an expansion of the cooling medium 10 enclosed by the casing 1, the said medium does not always expand exclusively upwards, but also sidewards into the protruding beads 9, so that the level of the liquid changes less than if the casing walls were to extend upwards in a rectilinear manner. At least one cover part 3 or 4 is elastically deformable within the central region 11 surrounded by the reinforcements 8, 9, so that the region 11 can be arched outwards (FIG. 3) in the event of an increasing internal pressure, or can be arched inwards (FIG. 5) in the case of a very low internal pressure. In the exemplified embodiment, both the closing-wall parts 3, 4 are deformable. As a result of this, a large range of different pressures can occur in the casing 1 without the latter's functioning being impaired.

Imperviousness in the edge region of the abutment of the closing-wall part 3 or 4 against the frame 2 remains guaranteed by the shape-preserving reinforcements 8, 9 and also by clamping elements 12 which pass through the closing-wall parts 3, 4 and brace them against one another on the frame 2. The clamping elements 12 are constructed as screw bolts and likewise pass through transition apertures 13 on the frame 2 which are constructed in reinforcing ribs 14 moulded onto the said frame and have metal sleeves 15 on the inside. On the one hand, the frame 2 is stiffened via the reinforcing ribs 14, but in addition the latter form, with their lateral end faces, an abutment for the closing-wall parts 3, 4, so that the latter cannot be bent round the edge of the frame 2, even when braced tightly, and to that extent imperviousness remains guaranteed. The reinforcing ribs 14 are preferably disposed on the outside of the frame 2 so as not to restrict the space it encompasses. Reinforcing ribs 14 protruding from the frame on both sides are also possible (FIG. 14, FIG. 15), and so too are reinforcing ribs 14 (FIG. 12, FIG. 13) located on the inside.

As the cooling medium 10, use is made, in particular, of a low-boiling liquid, the boiling point of which lies, for example, at about 35° C. at a pressure of 1 bar, and at about 120° C. at a pressure of 15 bar. In order to guarantee boiling-bath cooling, the interior of the casing 1 is in communication, via a gas exit 16, with a cooler in which evaporated cooling medium 10 is condensed by cooling-down and is fed into the interior of the casing again. For this purpose, the gas exit 16 is provided, on the one hand, with an internal gas line 17 and, on the other hand, with a condensate return line 18. In the exemplified embodiment, the condensate return line 18 surrounds the gas line 17 concentrically.

During operation, it must be ensured that only gaseous constituents of the cooling medium 10 pass out of the casing 1, in order to guarantee adequate embedding of the assembly 6 in liquid cooling medium 10. For this purpose, there is provided, in the upper region of the casing 1, a gas line 19 which connects the gas exit aperture 16 to two entry apertures 20, 21 disposed in the upper corner regions of the casing 1. The entry apertures 20, 21 lead, via parts 22 and 23 of the line, into a central upper region 24 of the casing 1, from which a further part 25 of the line branches off to the gas exit aperture 16. Under these circumstances, the parts 22, 23 of the line form loops 26, 27 in each case which, starting out from the central region 24, run through the upper corner region which is located opposite the entry aperture 20 or 21 in each case. This disposition of the gas line 19 guarantees that, even when the casing 1 is in an extreme oblique position (FIG. 9), such as may occur, for instance, during the running of motor vehicles, only one of the entry apertures 20, 21 is immersed and the liquid 10 is able to run over a central region 24 without liquid 10 leaving the casing via the gas exit 16. When the oblique location is reset, the liquid 10 forced into the parts 22, 23 of the line will, for the most part, flow back into the casing 1 again through the particular aperture 20, 21. Even while the casing is in this oblique location, the particular gas entry 20, 21 which is not immersed can continue to bring about an exchange of gas with the cooler via its connection 26 or 27 with the central region 24 and with that part 25 of the line which branches off from the said central region and leads to the gas exit aperture 16. By avoiding the egress of liquid from the casing 1, the liquid level is kept at such a height, even in the oblique location, that the assembly 6 remains immersed and consequently even electronic parts which are located in the upper region obtain the best possible cooling.

In order to obtain, on the one hand, isolation from shock and vibration and, on the other hand, screening against electromagnetic radiation and also thermal insulation, the casing 1 as a whole is held in an outer casing 30 in a manner suspended via vibration-dampers 31, the said outer casing 30 constituting a jacket for the inner casing 1. The casing 30 is at a distance from the casing 1, it being possible to insert in the intervening space additional insulating materials, for example foam materials or the like, for thermal insulation purposes, particularly in the form of half-shells 32, 33 which surround the casing 1.

In order to also guarantee isolation from vibrations in the region of the electrical lead-throughs, no electric cable leads directly into the casing 1 through a lead-through in a wall 40 of the outer casing 30, but instead the connecting cable 41 is laid in a meandering manner in the intervening space 44 and is secured both to the frame 2 of the casing 1 and also to the frame 40 of the outer casing 30, initial isolation being made possible by the loop 42 in the connecting cable 41 laid in the intervening space (FIG. 23). Furthermore, the assembly 6 in the interior of the casing 1 is not in direct contact with the frame 2 or the closing-wall parts 3, 4, but is at a distance from these. Electrical contact with the assembly 6 is produced via flexible metal sheets 43 which absorb further components of vibration.

As a result of this, even when a casing 1 of this kind, or an outer casing 30 which partially or completely surrounds the casing 1, is disposed near a vibrating internal combustion engine, a very high degree of isolation of the electronic assembly 6 located in the casing 1 from the vibrations of the engine or vehicle is guaranteed.

The outer casing 30 may constitute a capsule which surrounds the inner casing and is flanged directly onto the internal combustion engine. Instead of an outer casing 30, a cage which is not completely closed is also possible for achieving electromagnetic screening.

In order to facilitate the leading-in of cables through the outer casing 30, there are provided in the latter cut-out portions 45 into which plug-in parts 46 can be introduced which, for their part, have ducts 47 for cables which have been made up beforehand. Under these circumstances, the cables are already laid in the ducts 47 before the casing 30 is fitted, that is to say do not have to be led in through the said ducts during fitting. The plug-in parts 46 can be introduced into the cut-out portions 45 by a simple pushing movement during fitting. Under these circumstances, the plug-in parts 46 may be mounted via springs 48, in particular leaf springs. One of these plug-in parts 46 may also make available a passage for gas via its duct 47b.

In order to fulfil the requirements in respect of both imperviousness and stability, the frame 2 preferably consists of a polyphenylene sulphide (PPS) which represents a high-performance thermoplast which is uncritical at the temperature interval addressed and resistant to the cooling media used. During the manufacture of the said frame 2, electrical connecting parts 50 which pass through the frame 2 are integrally cast in the latter, so that they are embedded tightly in the plastic compound. Particularly suitable as closing-wall parts 3, 4 are sheet-metal parts which are capable of absorbing the high pressures (up to about 15 bar) that arise in the cooling medium 10 without sustaining damage, deformation of the central regions 11 being possible at the same time for the purpose of enlarging the volume. Basically, suitable plastic materials are possible for the closing-wall parts 3, 4.

Sealing between the frame 2 and a closing-wall part 3, 4 may be effected via various seals 5, for example an O-ring cord seal, a contoured flat seal, a shaped seal or a permanently elastic sealing compound (FIG. 19).

For sealing between the side-wall part 2 or closing-wall part 3, 4 in which the electric connecting parts 50 are integrally cast, provision is made for disposing, inside the casing 1, an annular groove 51 which is filled with sealing compound 52. As a result of this, it is possible to compensate for different temperature coefficients of the electrical connecting part, which is of metal construction, and the surrounding plastic compound, for example PPS, without the imperviousness between these components being impaired. The sealing compound 52 is permanently elastic, adheres both to metal and also to plastic, and seals the gap in a reliable manner. Placing the sealing compound 52 on the side facing towards the interior of the casing 1 ensures that, when a superatmospheric pressure prevails internally, the sealing compound 52 is pressed into the annular groove 51, as a result of which the sealing function is further improved. In addition, it is also possible to still carry out sealing on the outer side. The sealing compound 52 preferably encloses the electrical connecting part 50 over its entire periphery. Under these circumstances, the electrical connector 50 is preferably disposed in such a way that it is not integrally cast in the frame 2, or closing-wall parts 3, 4 on its own, but there is directly cast onto the outside of the wall part a plug attachment 53 which houses an end part 50a, which may possibly be angled, of the electrical connector 50, as a result of which the plug connection to lines that continue onwards is reliably sealed.

It is preferable if all the lead-throughs for electrical connecting parts 50 are additionally sealed with a sealing compound 52.

Three types of casing which are possible in principle are represented diagrammatically in FIG. 25. According to FIG. 25a, the side-wall part 2 is made, as in the exemplified embodiment explained above, from plastic material, in particular PPS, and the closing-wall parts 3, 4 can be both braced to the frame 2 and also welded. Welding presupposes that the cover parts 3, 4 also consist of plastic. The region 54 for leading through electrical connecting parts 50 is indicated by broken lines and is located in the frame 2.

Figure 25B:
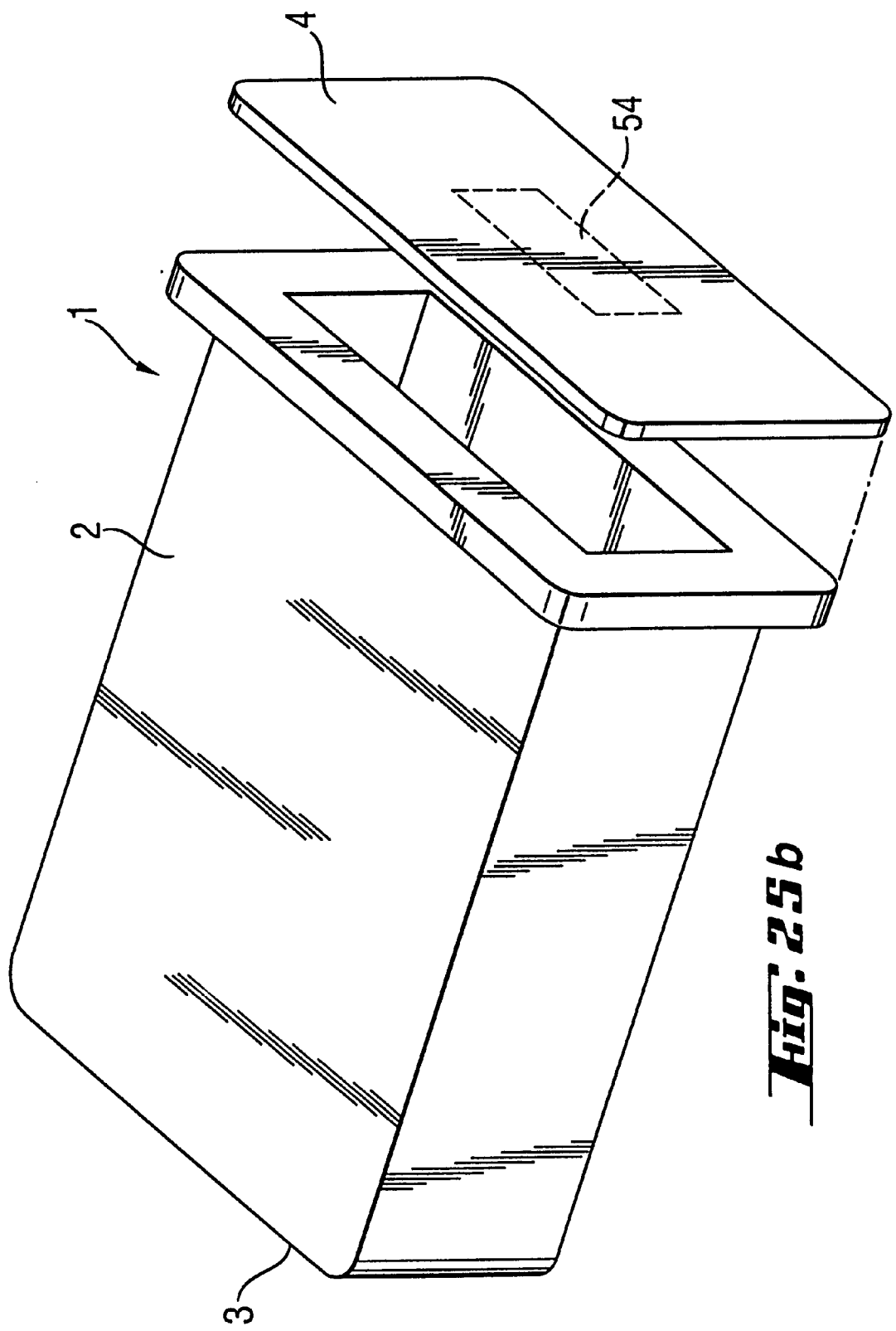

According to FIG. 25b, provision is made for the frame 2 to consist of a continuously cast part, particularly one made of metal. This can be welded, on the end face, to a closing-wall part 3 which is likewise made of metal while, at the other end, the end face is formed by another closing-wall part 4 which contains the lead-throughs 54 for the electrical connecting parts 50. A closing-wall 4 of this kind would, once again, be produced from a plastic material.

According to FIG. 25c, provision is made for the closing-wall part 4 to be constructed so as to be integral with the frame 2, and for the container space thus produced to be closed on the upper side by a closing-wall part 3. The closing-wall part 3 can, once again, be fastened to the frame 2 in various ways and, in particular, welding is also a possibility, in addition to bracing, when constructing plastic parts.

It is left to the person skilled in the art to decide which type of casings he chooses for which conditions of installation, but it remains particularly advantageous, in respect of good bulging capacity and high stability, to use a circumferential frame 2 made of PPS for example, which is braced, on both sides, to closing-wall parts 3, 4 made of metal material. In addition, a connection of this kind can be undone again for maintenance and repair purposes.

What is claimed is:

1. A casing (1) for housing electrical or electronic components (6) surrounded by a cooling medium (10), said casing comprising a side-wall part and an upper and lower closing-wall part (3,4), characterized in that the side-wall part or one of the closing-wall parts (3,4) comprises electrically insulating, castable material and electrical connecting parts (50) integrally cast in the material, the side-wall part and the closing-wall parts (3,4) jointly enclosing, in a pressure-tight manner, a housing space which can be filled with the cooling medium (10) for the boiling-bath cooling of the electrical or electronic components, at least one of the closing-wall parts (3,4) has at least one outwardly protruding shape-preserving reinforcement (8) disposed within said closing wall part for receiving a portion of the cooling medium during a rise in pressure within the casing.

2. The casing according to claim 1, characterized in that the side-wall part is constructed as a circumferential frame (2) made of an electrically insulating material and having electrical connecting parts (50) integrally cast therein, in which the frame is clamped on both sides in a pressure-tight manner by cover parts (3,4).

3. The casing according to claim 2, characterized in that the electrical connecting parts (50) are sealed off, on at least one side, in relation to one of the closing-wall parts (3,4) or side-wall part surrounding the connecting parts, by means of a sealing compound (52) which is additionally introduced.

4. The casing according to claim 3, characterized in that, for receiving the sealing compound (52) there is disposed around one end of the electrical connecting parts (50) an annular groove (51) which is filled with the sealing compound (52), at least in certain regions, when the connecting parts are in fitted condition, the annular groove facing the interior of the casing such that at superatmospheric pressures the sealing compound is pressed into the annular groove and ensures a pressure tight seal.

5. The casing according to claim 4, characterized in that the sealing compound (52) is formed from a permanently elastic, soft material which adheres to metal and plastic.

6. The casing according to claim 1, characterized in that at least one of the closing-wall parts (3,4) has an elastically deformable central region (11) for adapting to a pressure difference between the pressures prevailing inside and outside the casing (1).

7. The casing according to claim 6, characterized in that the closing-wall parts (3,4) are secured on the frame (2) by means of clamping elements (12).

8. The casing according to claim 7, characterized in that the clamping elements (12) are constructed as screw bolts and pass through moulded-on transition apertures on the frame (2).

9. The casing according to claim 8, characterized in that the transition apertures are constructed in moulded-on reinforcing ribs (14) on the frame (2) and contain metal bushes (15) on the inside.

10. The casing according to claim 1, characterized in that the side-wall part is welded to at least one of the closing-wall parts (3,4).

11. The casing according to claim 1, characterized in that the casing (1) is disposed in an outer casing (30) forming an outer capsule and is suspended therein by vibration-dampers (31) and disposed at a distance from the external casing (30) such that electrical connecting lines (41) can be laid, for the purpose of providing isolation from the vibrations, in a meander-shaped manner in the intervening space located between the casing (1) and the outer casing (30).

12. The casing according to claim 1, characterized in that the casing (1) is disposed in an outer casing (30) which forms an outer capsule and has plug-in parts (46) which are provided with cable lead-throughs (47), it being possible to secure the said plug-in parts (46) in cut-out portions (45) in wall regions (40) of the outer casing (30).

13. The casing according to claim 1, characterized in that the frame (2) consists of fibre-reinforced polyphenylene sulphide.

14. The casing according to claim 1, characterized in that the closing-wall parts (3,4) consist of metal material.

15. The casing according to claim 1, characterized in that it has thermal insulation made from two half-shells (32,33) engaging round it.

16. A casing (1) for housing electrical or electronic components (6) surrounded by a cooling medium (10), said casing comprising a side-wall part and an upper and lower closing-wall part (3,4), characterized in that the side-wall part or one of the closing-wall parts (3,4) comprises electrically insulating, castable material and electrical connecting parts (50) integrally cast in the material, the side-wall part and the closing-wall parts (3,4) jointly enclosing, in a pressure-tight manner, a housing space which can be filled with the cooling medium (10) for the boiling-bath cooling of the electrical or electronic components, the upper region of the casing having a gas line (19) which leads to an exit aperture (16) and at least two entry apertures (20,21) which are associated with upper corner regions of the casing and to which there are connected parts (22,23) of the line which are in communication with one another in a cental upper region (24) of the casing (1), a further part (25) of the line branching off to the exit aperture (16) from the central region (24).

17. The casing according to claim 16 characterized in that the parts (22,23) of the line form loops (26,27) which, starting out from the central region (24), run through the corner region which is located opposite the entry aperture (20,21) in each case.

18. The casing according to claim 16, characterized in that at least one of the closing-wall parts (3,4) has at least one shape-preserving reinforcement (8) disposed therein.

19. The casing according to claim 16, characterized in that, in at least one of the closing-wall parts (3,4), a bead (9) is constructed in the upper region of the casing (1) as an outwardly moulded receiving pocket for the cooling medium (10).

20. The casing according to claim 16 characterized in that the receiving pocket is disposed underneath the entry aperture (20,21) of the gas line (19).

21. A casing (1) for housing electrical or electronic components (6) surrounded by a cooling medium (10), characterized in that at least one of the closing-wall parts (3,4) has at least one outwardly protruding shape-preserving reinforcement (8) disposed within the closing wall part at the periphery thereof, at least one of the closing-wall parts (3,4) has an elastically deformable central region (11) for adapting to a pressure difference between the pressures prevailing inside and outside the casing (1), the closing-wall parts (3,4) are secured on the frame (2) by means of clamping elements (12), the clamping elements (12) are constructed as screw bolts and pass through moulded-on transition apertures on the frame (2), the transition apertures are constructed in moulded-on reinforcing ribs (14) on the frame (2) and contain metal bushes (15) on the inside.

* * * * *